United States Patent [19]

Matsui et al.

[11] Patent Number: 5,229,607
[45] Date of Patent: Jul. 20, 1993

[54] COMBINATION APPARATUS HAVING A SCANNING ELECTRON MICROSCOPE THEREIN

[75] Inventors: Hironobu Matsui, An Yang; Mikio Ichihashi, Kodaira; Sumio Hosaka, Hinode; Yoshinori Nakayama, Sayama; Satoshi Haraichi, Yokohama; Fumikazu Itoh, Fujisawa; Akira Shimase, Yokohama; Yoshimasa Kondo, Koganei; Shigeyuki Hosoki, Hachioji; Masakazu Ichikawa, Tokyo; Yukio Honda, Fuchu; Tsuyoshi Hasegawa, Tokyo; Shiji Okazaki, Urawa; Shunji Maeda, Yokohama; Hitoshi Kubota, Fujisawa, all of Japan

[73] Assignee: Hitachi, Ltd., Tokyo, Japan

[21] Appl. No.: 714,018

[22] Filed: Jun. 12, 1991

Related U.S. Application Data

[63] Continuation-in-part of Ser. No. 686,922, Apr. 18, 1991.

[30] Foreign Application Priority Data

| Apr. 19, 1990 | [JP] | Japan | 2-101778 |
| Apr. 19, 1990 | [JP] | Japan | 2-101779 |
| Apr. 27, 1990 | [JP] | Japan | 2-110116 |
| Jun. 13, 1990 | [JP] | Japan | 2-152820 |
| Jun. 20, 1990 | [JP] | Japan | 2-159733 |
| Nov. 28, 1990 | [JP] | Japan | 2-322303 |
| Nov. 28, 1990 | [JP] | Japan | 2-322304 |

[51] Int. Cl.$^5$ ............... H01J 37/00; H01J 37/12; H01J 37/26
[52] U.S. Cl. ............... 250/306; 250/310; 250/396 R
[58] Field of Search ............ 250/306, 423 F, 310, 250/396 R

[56] References Cited

U.S. PATENT DOCUMENTS

| 4,349,242 | 9/1982 | Ogura | 250/310 |
| 4,537,477 | 8/1985 | Takagi et al. | 250/311 |
| 4,663,525 | 5/1987 | Ohtsuki et al. | 250/396 R |
| 4,798,989 | 1/1989 | Miyazaki et al. | 250/311 |
| 4,874,945 | 10/1989 | Ohi | 250/306 |
| 4,883,959 | 11/1989 | Hosoki et al. | 250/310 |
| 4,896,036 | 1/1990 | Rose et al. | 250/396 R |
| 4,999,495 | 3/1991 | Miyata et al. | 250/306 |
| 5,041,783 | 8/1991 | Ohta et al. | 250/306 |
| 5,055,680 | 10/1991 | Kesmold et al. | 250/306 |
| 5,081,353 | 1/1992 | Yamada et al. | 250/306 |

FOREIGN PATENT DOCUMENTS

61-256554 11/1986 Japan.

OTHER PUBLICATIONS

Gerber et al., "Scanning tunneling microscope combined with a scanning electron microscope"; Rev. Sci. Instrum. 57(2), Feb. 1986; pp. 221-224.

*Primary Examiner*—Bruce C. Anderson
*Attorney, Agent, or Firm*—Fay, Sharpe, Beall, Fagan, Minnich & McKee

[57] ABSTRACT

A combination apparatus having a scanning electron microscope includes equipment for performing any of observing, measuring and processing operations on a sample placed in a sample chamber. The sample chamber contains a focused electron beam irradiating unit apart from the components for performing the observing, measuring and processing operations. The focused electron beam irradiating unit irradiates a finely focused electron beam onto the surface of the sample for electron microscopic observation in scanning fashion. This setup allows the observing, measuring or processing equipment to combine with the scanning electron microscope without appreciably enlarging the construction of the combination apparatus.

29 Claims, 6 Drawing Sheets

COMBINATION APPARATUS HAVING A SCANNING ELECTRON MICROSCOPE THEREIN

CROSS-REFERENCE TO RELATED APPLICATIONS

The present application is a continuation-in-part of copending application Ser. No. 07/686,922 filed on Apr. 18, 1991; which is incorporated by reference herein in its entirety.

BACKGROUND OF THE INVENTION

This invention relates to a combination apparatus having a scanning microscope therein. More particularly, the invention relates to a combination apparatus comprising a scanning electron microscope (SEM); observing and measuring equipment such as a scanning tunneling microscope (STM) and an atomic force microscope (AFM); and processing equipment such as a chemical vapor deposition device (CVD), focused ion beam device (FIB) and a dry etching device.

Because near-field microscopes such as the scanning tunneling microscope (STM) are intrinsically not fit for wide-field observation, this type of microscope is commonly combined with the scanning electron microscope (SEM) so as to provide a wider range of field choices.

The observing and measuring equipment (STM, etc.) is combined with the scanning electron microscope (SEM) by illustratively incorporating the STM function section into the sample chamber of a large SEM that uses an electromagnetic lens arrangement to focus the electron beam. One such combination apparatus is disclosed in "Review of Scientific Instruments," Vol. 57, No. 2 (1986), pp. 221-224.

Meanwhile, the processing equipment (CVD, FIB, dry etching device, etc.) is combined with the scanning electron microscope in order to monitor samples throughout the processing thereof.

The prior art combination of the processing equipment with the scanning electron microscope is implemented illustratively as follows. A large scanning electron microscope is installed alongside processing equipment, the microscope utilizing an electromagnetic lens arrangement to focus the electron beam. The sample chamber of the processing equipment is connected via a connecting passage to that of the scanning electron microscope. For observation of a sample by microscope, the sample is relocated through the connecting passage from the sample chamber of the working equipment to that of the microscope. One such implementation is disclosed in Japanese Patent Laid-Open No. 61-256554.

The above-noted prior art involves the use of a very large scanning electron microscope. Because of its size, the scanning electron microscope, when combined with other equipment (observing and measuring instruments such as STM or processing equipment such as CVD, FIB or dry etching device), has posed a problem: the combination tends to constitute an enormous apparatus.

There is another problem in combining the scanning electron microscope with the observing and measuring equipment or with the processing equipment as per the prior art. The scanning electron microscope additionally needs its own evacuation system besides that for the equipment it combines with.

A further problem is encountered when the scanning electron microscope is conventionally combined with the observing and measuring equipment. Because the scanning electron microscope is fixedly mounted, it requires its own sample moving mechanism for scanning microscopic observation in addition to the comparable mechanism on the side of the observing and measuring equipment. A still further problem is experienced with the conventional combination of the scanning electron microscope with the processing equipment. That is, a sample moving mechanism is needed to relocate the sample from the sample chamber of the processing equipment to that of the microscope. The mechanisms for moving the sample and the operations for accomplishing such sample movements are complex and troublesome.

SUMMARY OF THE INVENTION

It is therefore an object of the present invention to provide a combination apparatus having a scanning electron microscope therein, the apparatus combing observing and measuring equipment or processing equipment with the microscope without appreciably enlarging the structure of the equipment.

It is another object of the invention to provide a combination apparatus having a scanning electron microscope therein, the apparatus combining observing and measuring equipment or processing equipment with the microscope without attaching to the equipment an additional evacuation system.

It is a further object of the invention to provide a combination apparatus having a scanning electron microscope therein, the apparatus combining observing and measuring equipment or processing equipment with the microscope without attaching to the equipment an additional sample moving mechanism.

It is a still further object of the invention to provide a combination apparatus having a scanning electron microscope therein, the apparatus combining processing equipment with the microscope and containing improvements for keeping the microscope performance intact regardless of the processing of the sample.

In achieving the foregoing and other objects of the invention and according to a first aspect thereof, there is provided a combination apparatus having a scanning electron microscope therein, the apparatus observing, measuring or processing a sample placed in a sample chamber thereof, the internal space of the sample chamber comprising a focused electron beam irradiating means for irradiating a finely focused electron beam in scanning fashion onto the surface of the sample for microscopic observation.

According to a second aspect of the invention, there is provided a combination apparatus having a scanning electron microscope therein, the apparatus observing, measuring or processing a sample placed in a sample chamber thereof, the apparatus comprising a focused electron beam irradiating means for irradiating a finely focused electron beam in scanning fashion onto the surface of the sample for microscopic observation, the sample chamber of the apparatus and the focused electron beam irradiating means sharing an evacuation system therebetween, the evacuation system evacuating the inside of the sample chamber as well as the inside of the focused electron beam irradiating means.

According to a third aspect of the invention, there is provided a combination apparatus having a scanning electron microscope therein, the apparatus observing, measuring or processing a sample, wherein a focused electron beam irradiating means incorporated in or externally attached to the apparatus is relatively changed in positional relation to the sample by additional means.

According to a fourth aspect of the invention, there is provided a combination apparatus having a scanning electron microscope therein, the apparatus observing, measuring or processing a sample placed in a sample chamber thereof, the sample chamber incorporating a plurality of focused electron beam irradiating means which are switched as desired for use.

According to a fifth aspect of the invention, there is provided a combination apparatus having a scanning electron microscope therein and comprising a secondary electron detecting means and a focused electron irradiating means, the secondary electron detecting means detecting secondary electrons generated upon irradiation of the focused electron beam onto a sample, wherein the relative position of the secondary electron detecting means with respect to the sample is changed in conjunction with the relative position of the focused electron beam irradiating means with respect to the same sample.

According to a sixth aspect of the invention, there is provided a combination apparatus having a scanning electron microscope therein and comprising a focused electron beam irradiating means and a shielding means, the focused electron beam irradiating means being shielded by the shielding means from the area where a sample is processed by the apparatus.

According to a seventh aspect of the invention, there is provided a combination apparatus having a scanning electron microscope therein and comprising a focused electron beam irradiating means which contains an electron beam focusing means, the entire electron beam focusing means being composed of an electrostatic lens arrangement.

As described and according to the invention, the sample chamber of the observing, measuring or processing equipment contains therein the focused electron beam irradiating means. This feature allows the equipment to combine with the scanning electron microscope without enlarging the equipment construction.

As described, the observing, measuring or processing equipment shares an evacuation system with the focused electron beam irradiating means. This feature allows the equipment to combine with the scanning electron microscope without installing a new evacuating means for use with the focused electron beam irradiating means.

As described, the relative position of the focused electron beam irradiating means with respect to the sample is made variable. This feature allows the observing, measuring or processing equipment to combine with the scanning electron microscope without adding a new sample moving mechanism to the equipment.

As described, the sample chamber of the observing, measuring or processing equipment incorporates a plurality of focused electron beam irradiating means which are switched as desired. This feature makes it possible to change as needed the position and direction of the focused electron beam irradiated onto the sample.

And, as described and according to the invention, the added shielding means shields the focused electron beam irradiating means from the area where the sample is processed. This feature allows the processing equipment to combine with the scanning electron microscope in such a way that the microscope performance remains intact regardless of the processing of the sample.

The above and other related objects and features of the invention, as well as the novelty thereof, will clearly appear from the following description and from the accompanying drawings.

DESCRIPTION OF PREFERRED EMBODIMENTS

The preferred embodiments of the invention will now be described with reference to the accompanying drawings.

Figure 1:
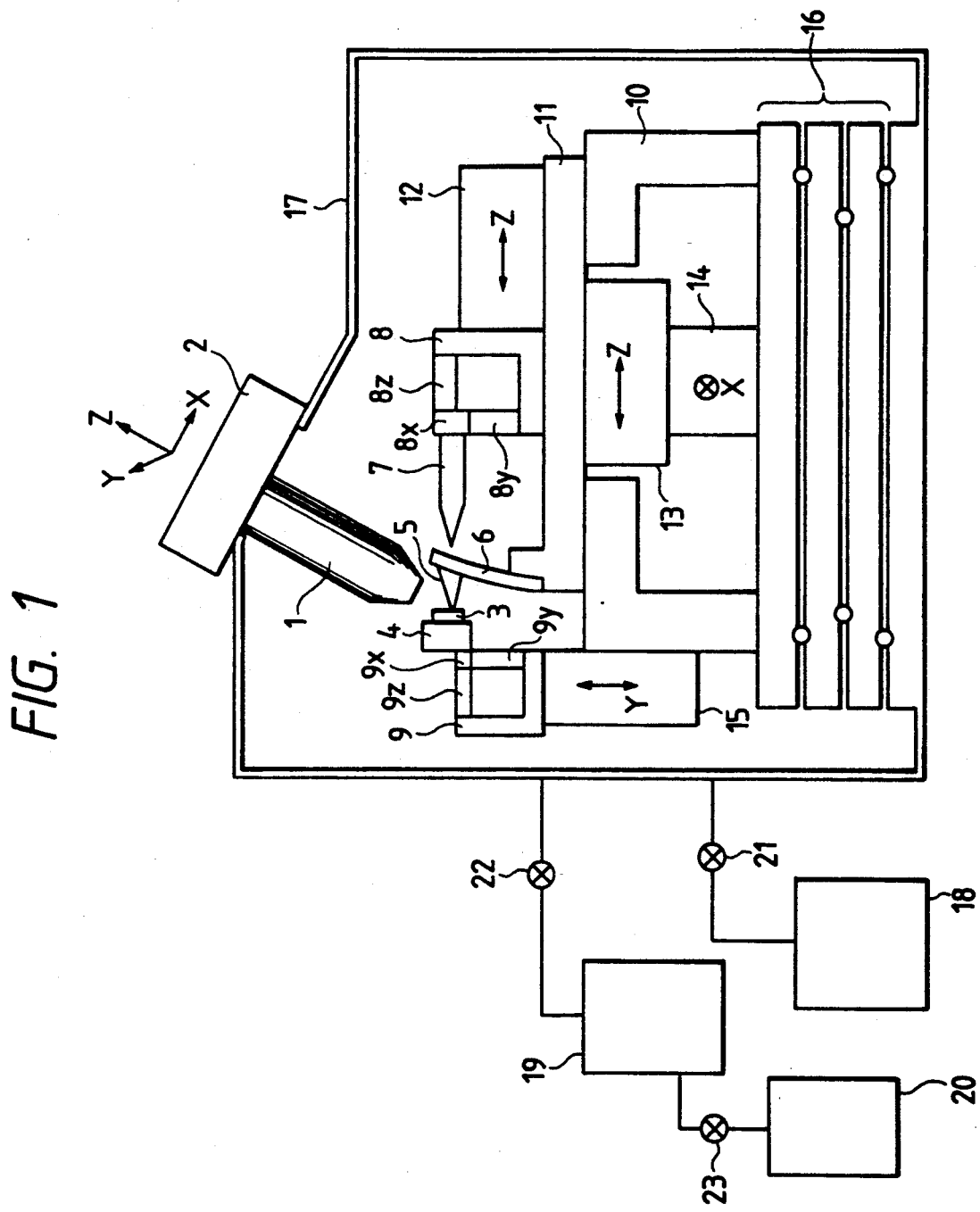
FIG. 1 is a sectional view schematically showing an atomic force microscope combined with a scanning electron microscope, the combination apparatus being practiced as a first embodiment of the invention.

FIG. 1 shows the combination apparatus practiced as the first embodiment of the invention. This embodiment comprises an atomic force microscope (AFM) that operates on the scanning tunneling microscope (STM) principle. The sample chamber of the atomic force microscope incorporates a very small scanning electron microscope. An ultra high vacuum vessel 17 contains the atomic force microscope. A tube 1 of the very small scanning electron microscope is secured with a three-dimensional (X, Y, Z) moving mechanism 2.

The atomic force microscope (AFM) comprises a sample table 4 that supports a sample 3; an AFM probe 5; a cantilever 6 that supports the AFM probe 5; an STM probe 7; a tripod type scanner 8 made of piezoelectric elements 8x, 8y and 8z for controlling the STM probe 7 in three dimensions (X, Y, Z); a tripod type scanner 9 made of piezoelectric elements 9x, 9y and 9z for controlling the sample table 4 in three dimensions (X, Y, Z); a base 10, a slider 11 which, carrying the cantilever 6 and the STM scanner 8, slidingly moves on the base 10; a step moving mechanism 12 that moves the STM scanner 8 in the Z axis direction on the slider 11; step moving mechanisms 13 and 14 that move the slider 11 in the Z and X axis directions, respectively, on the base 10; a step moving mechanism 15 that moves the AFM scanner 9 in the Y axis direction on the base 10; and a layered type vibration proofing mechanism 16. Control systems for controlling the operation of the respective components are not shown.

The atomic force microscope of the above-described construction operates in a constant repulsion mode (in which the repulsion between the tip of the probe 5 and the sample 3 is kept constant). As the Z axis piezoelectric element 9z of the AFM scanner 9 is extended to bring the sample 5 closer to the tip of the probe 5, an interatomic force (repulsion in this case) generated between the tip of the probe 5 and the sample 3 causes the cantilever 6 to warp. At this point, the extending operation of the Z axis piezoelectric element 9z is controlled so as to keep the attitude of the cantilever 6 (i.e., its warped state) constant. Whether or not the cantilever 6 remains constant in its attitude is ascertained by checking to see if the distance between the tip of the STM probe 7 and the cantilever 6 stays constant. That is, the attitude of the cantilever 6 is held constant by monitoring the tunnel current that flows between the tip of the STM probe 7 and the cantilever 6, and by controlling the extending operation of the Z axis piezoelectric element 9z so that the tunnel current will stay constant.

As described, the Z axis piezoelectric element 9z controls the sample 3 in the Z axis direction to keep the attitude of the cantilever 6 constant while the sample table 4 is being scanned two-dimensionally (e.g., for raster scan) by the X and Y axis piezoelectric element 9x and 9y of the AFM scanner 9. At this point, the scanning signals (driving signals for piezoelectric elements 9x, 9y) and the driving signal for the piezoelectric element 9z are used to display on the screen the surface structure of the sample 3 for observation.

One disadvantage of the above-described atomic force microscope (AFM) is that it can, at most observe a range of several square micrometers on the sample surface because of the difficulty in ensuring a wide scanning range for the AFM scanner 9. This makes it necessary to utilize beforehand a scanning electron microscope having a wide scanning range to observe a wide range of the sample surface and thereby to find out the desired area for AFM observation. Since the above-noted atomic force microscope (AFM) comprises the STM mechanism, the STM probe 7 needs to be precisely aligned with the back of the cantilever 6.

Figure 2:
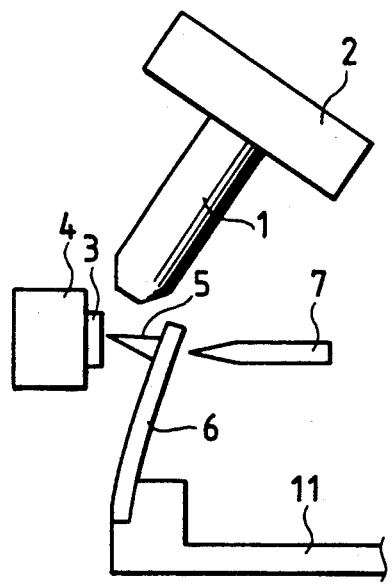
FIG. 2 is a view depicting how the tube of the scanning electron microscope of FIG. 1 is relatively positioned with respect to a sample for scanning microscopic observation.
Figure 3:
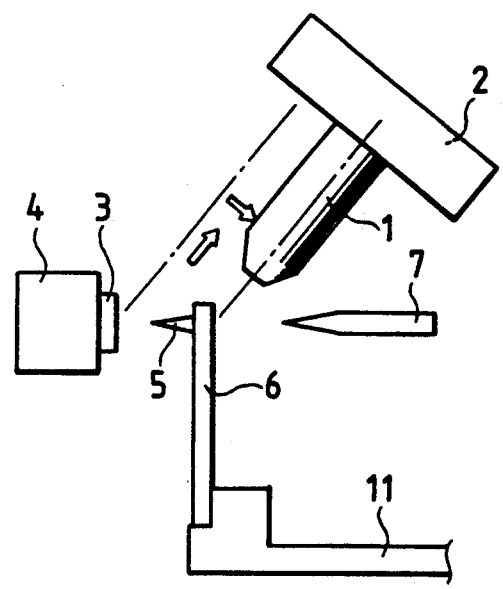
FIG. 3 is a view illustrating how the tube of the same scanning electron microscope is relatively positioned with respect to a cantilever of the first embodiment, where the back of the cantilever is viewed for scanning microscopic observation.

In this first embodiment, the field of AFM observation is selected illustratively in two ways as shown in FIG. 2: by directing the optical axis (electron beam axis) of the SEM tube 1 at the surface of the sample 3 for SEM observation over a wide range of the sample surface; or by simultaneously observing the sample surface and the tip of the AFM probe 5 for verification of the positional relation therebetween. The STM probe 7 is aligned with the back of the cantilever 6 as shown in FIG. 3. That is, the moving mechanism 2 moves the SEM tube 1 in the X, Y, or Z axis direction so as to direct the optical axis of the tube at the back of the cantilever 6. The back of the cantilever 6 and the STM probe 7 are simultaneously placed under SEM observation. While being observed, the STM probe 7 is aligned with the back of the cantilever 6.

Figure 4:
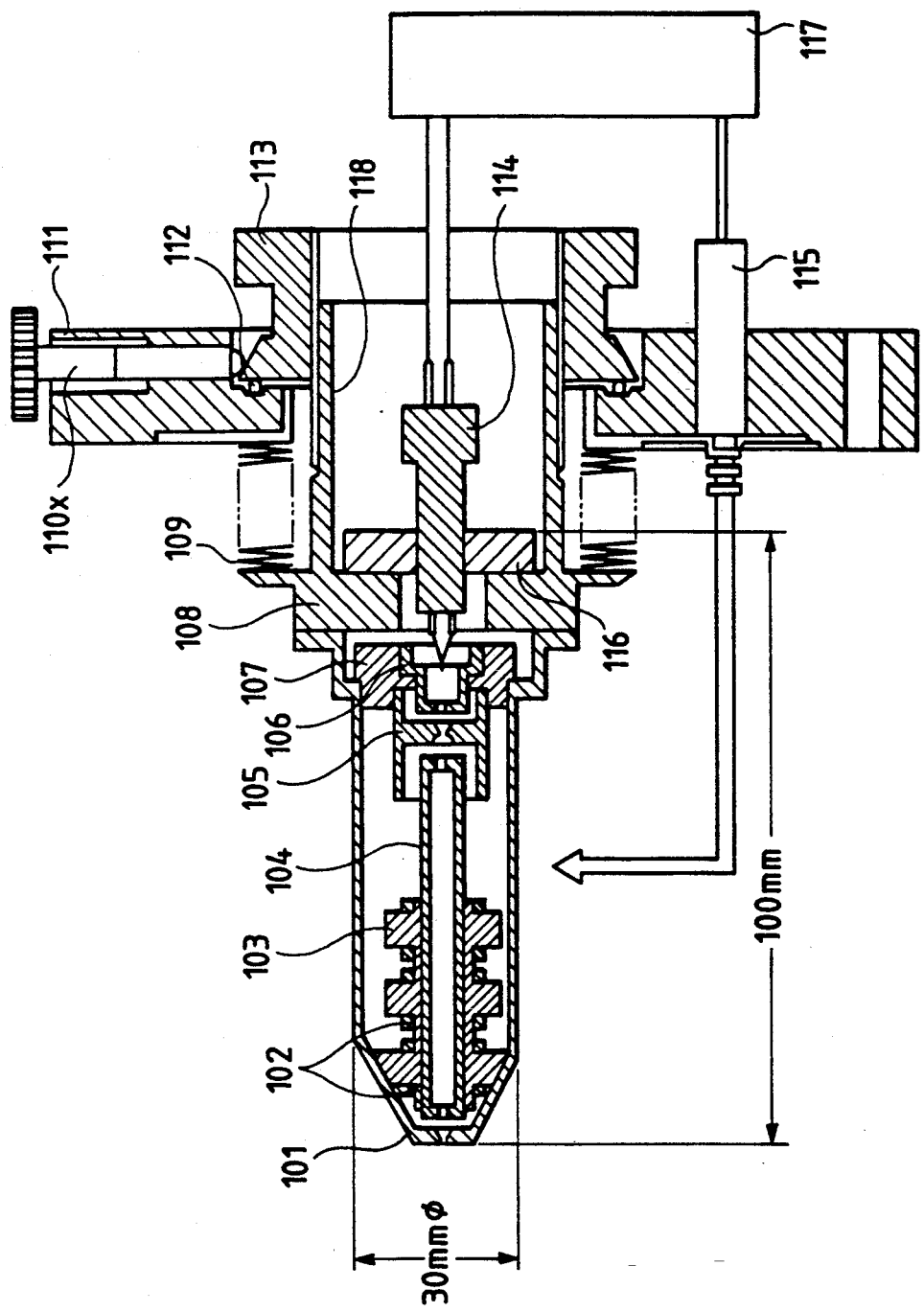
FIG. 4 is a sectional view specifically showing how the tue of the scanning electron microscope along with its tube moving mechanism is incorporated in the first embodiment.

FIG. 4 specifically shows how the SEM tube 1 and the tube moving mechanism 2 are incorporated in the first embodiment. In FIG. 4, the very small SEM tube 1 uses as its electron focusing lens an electrostatic lens arrangement comprising electrodes 101, 104, 105 and 106 instead of an electromagnetic lens arrangement requiring exciting coils. This construction makes for a very small tube.

Illustratively, the first electrode 101 measures 30 mm in outer diameter (i.e., tube diameter), and the distance between the top surface of an electron gun attached to a flange 116 and the bottom surface of the first electrode 101 is 100 mm (i.e. tube length). As described, the SEM tube entirely composed of the electrostatic lens arrangement according to the invention is about one hundredth (1/100) the volume o the prior art tube construction that uses electromagnetic lenses. The significantly reduced size makes it possible to house the entire SEM tube 1 in the AFM ultra high vacuum vessel 17, to move the tube 1 inside the vessel 17, and to have the tube 1 share its evacuation system with the microscope.

The SEM tube 1 comprises an electron gun 114; the first electrode 101; the second electrode 104; the third electrode 105; the fourth electrode 106; a deflecting coil 102 (or deflecting coil containing an alignment coil); an insulator bobbin 103 to which to attach the deflecting coil; an insulator 107 that supports the electrodes 105 and 106; a holder 108 that secures the tube 1; and the flange 116 that supports the electron gun 114. The tube 1 is attached through a bellows 109 to a flange 111 hermetically mounted at an opening of the vacuum wall of the ultra high vacuum vessel 17.

The moving mechanism 2 that moves the tube 1 comprises a Z axis moving mechanism and an X-Y axis moving mechanism. The Z axis moving mechanism moves the tube in the optical axis direction (i.e., Z axis direction) through revolutions of a nut 113 engaged with a threaded portion 118 formed at the top of the holder 108. The X-Y axis moving mechanism moves the tube 1 in a plane perpendicular to the optical axis (i.e., X and Y axis direction) through revolutions of fine-adjusting screws 110x and 110y (the latter screw not shown), the screws 110x and 110y contacting the sides of the nut 113 in the X and Y axis directions, respectively. Ball bearings 112 are provided between the bottom surface of the nut 113 and the flange 111 to smooth the movement of the nut 113. Between the holder 108 and the flange 111 is the bellows 019 that elastically deforms. This arrangement permits movement of the tube 1 while maintaining the high degree of vacuum inside the ultra high vacuum vessel 17.

The scanning electron microscope (SEM) of the above-described construction operates as follows. Referring to FIG. 4, an electron beam is extracted from the electron emitting tip of the electron gun 114 by means of an extraction field formed between that tip and the fourth electrode 106 that acts as an electron extraction electrode. The extracted electron beam is finely focused by a condenser lens comprising the second, third and fourth electrodes 104, 105 and 106 and by an objective lens made of the first and second electrodes 101 and 104.

The focused electron beam is irradiated onto the sample 3. Then the focused electron beam is deflected by the electromagnetic deflecting coil 102 (or electrostatic deflecting electrode) within the space surrounded by the second electrode 104, the potential of the space being kept the same as that of the electrode 104. The deflection of the electron beam is performed so as to scan the surface of the sample 3 two-dimensionally.

Secondary electrons emitted from the surface of the sample 3 upon irradiation of the electron beam are detected by a secondary electron detector, not shown. The resulting detection signal serves as a video signal that displays a two-dimensional image of the surface of the sample 3 on the screen of a control and display unit 117.

Control, signal processing and image display operations are all effected and controlled by the control and display unit 117. Lead-in terminals 115 serve as conduits through which the electrodes and coils of the tube are supplied with voltages and currents, and through which the secondary electron detection signal is taken out. In FIG. 4, details of the wiring involved with the terminals 115 are omitted to avoid cluttering the illustration.

Of the first and second electrodes 101 and 104 making up the objective lens, the second electrode 104 on the side of the electron gun 114 is supplied with a positive voltage as opposed to the first electrode 101 (at ground potential). The voltage fed to the second electrode 104 is regulated so as to adjust the electric field between that electrode and the first electrode 101. That in turn controls the intensity of the lens action provided by the objective lens.

When a suitable relationship is established between the voltages applied to the two electrodes 101 and 104, the principal plane of the objective lens is formed under the first electrode 101. In this manner, the distance between the principal plane of the lens and the surface of the sample 3 is minimized, and the optical aberration involved in this case is made smaller than if an electromagnetic objective lens were employed.

The condenser lens described above controls the electron current and adjusts the beam spot diameter and focal depth. When the voltage of the third electrode 105 is adjusted to intensify the lens action of the condenser lens and to weaken the lens action of the objective lens, focusing the electron beam onto the sample surface enlarges the beam spot diameter thereon and reduces resolution, but increases the electron current (probe current) irradiated at the sample and deepens the focal depth. This setting is particularly effective where, as shown in FIG. 3, the STM probe 7 is to be aligned with the back of the cantilever 6, or in other cases where a wide range of the sample surface is to be observed at low magnification with a deep focal depth. Conversely, if it is desired to view the sample surface with a small beam spot diameter for high resolution observation, the lens action of the condenser lens is to be reduced and that of the objective lens intensified for the focusing operation.

In the first embodiment, voltages and currents are introduced through the multiple lead-in terminals 115 (one of which is shown) and supplied to the electrodes and coils in the SEM tube 1 in the vacuum vessel 17. In this setup, the flange 111 is equipped not only with the SEM tube 1 and the X-Y-Z moving mechanism 2 but also with the lead-in terminals 115 for supplying the voltages and currents by which to drive the tube. This is an important feature that contributes to constituting a combination apparatus compactly incorporating the scanning electron microscope (SEM) in the vacuum sample chamber of the equipment such as the AFM.

In the first embodiment, the evacuation system for the atomic force microscope (AFM) is also used to evacuate the inside of the SEM tube 1. This arrangement requires suitable considerations for the structure of the first through fourth electrodes and the construction of their supports so that the SEM tube 1 will be evacuated efficiently. One such consideration would be to make a large number of small holes in these electrodes and in the side walls of the cylindrical portions of the electrode supports.

The evacuation system that evacuates both the AFM and the SEM tube 1 is preferably an ultra high vacuum pump. For example, in FIG. 1, ultra high vacuum pump 21 is a noble pump, ion pump or a titanium getter pump; an ultra high vacuum pump 22 is a turbo molecular pump, a noble pump, an ion pump or a titanium getter pump; and low vacuum pump 23 is an oil-sealed rotary vacuum pump. The ultra high vacuum pumps 21 and 22 are connected to the ultra high vacuum vessel 17 via vacuum valves 24 and 25. The low vacuum pump 23 is connected via a vacuum valve 26 to the low vacuum side of the ultra high vacuum pump 22.

The secondary electron detector, not shown, may be one of those conventionally used with scanning electron microscopes. The secondary electron detector in this embodiment may be mounted on a separate flange. However, if enough space is available, mounting the detector on the same flange to which the SEM tube 1 is attached offers a higher degree of convenience.

The SEM tube 1 is moved in the X or Y axis direction by turning the fine-adjusting screws 110x and 110y (the latter not shown). Revolutions of the screws 110x and 110y are transmitted to the nut 113 which in turn fine-adjusts the holder 108 in the X or Y axis direction as desired (range of fine-adjusting: about 1 mm$^2$). Because the nut 113 is held by atmospheric pressure in contact with the flange surface, the intervention of the ball bearings 112 therebetween is important in facilitating the movement of the nut 113. The SEM tube 1 is moved in the Z axis direction by turning the nut 113.

Turns of the nut 113 move the holder 108 up and down.

The moving mechanism of the above-described construction is used to move the tube 1 so that the embodiment may be used under such conditions as depicted in FIGS. 2 and 3. The center axis (optical axis) of the tube 1 is inclined against the flange surface illustratively by rendering the bottom surface of the nut 113 spherical and by interposing between the spherical nut surface and the ball bearings 112 an intermediate moving member having a spherical seat. In this case, the fine-adjusting screws 110x and 110y are made to contact the intermediate moving member. When the inclined movement of the tube 1 is combined with the above-described movement in the X and Y directions, the tube 1 may be moved in a much more complex manner than has been conventionally possible.

Figure 5:
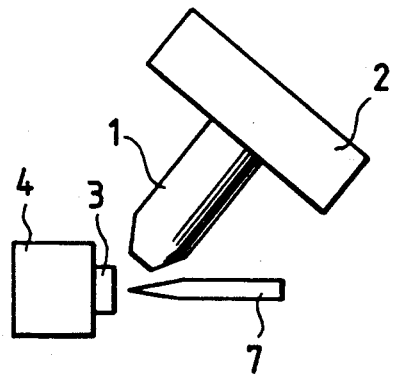
FIG. 5 is a view depicting how a scanning tunneling microscope is combined with a scanning electron microscope as a second embodiment of the invention, wherein the tube of the scanning electron microscope is relatively positioned a shown with respect to a sample for scanning microscopic observation.

FIG. 5 schematically shows how a scanning tunneling microscope (STM) is combined with a very small scanning electron microscope (SEM) as the second embodiment of the invention. The second embodiment is similar to the embodiment of FIG. 1 except that the AFM probe 5 and the cantilever 6 are removed, and the STM probe 7 is located directly closer to the surface of the sample 3 for STM observation. This scanning tunneling microscope (STM) contains the very small scanning electron microscope (SEM) for SEM observation of the sample surface or of the tip of the STM probe 7 for evaluation of the tip. The second embodiment also needs the SEM tube 1 and its moving mechanism 2, the tube having capabilities for SEM observation at high and low magnifications. These components are readily incorporated by adopting the construction similar to that of the first embodiment described with reference to FIGS. 1 through 4.

The incorporated scanning electron microscope (SEM) may be used to obtain reflected electron images, sample absorbed and Auger electron images in addition to the secondary electron image described earlier. In such cases, the reflected electrons are detected by a semiconductor detector and the Auger electrons by an energy analyzer. These detectors, not shown, may be of conventional type and may be located suitably close to the sample 3.

Although the above-described second embodiment specifically combines the very small scanning electron microscope (SEM) with the atomic force microscope (AFM) or scanning tunneling microscope (STM), the structure and the physical and electrical properties of the sample surface may be observed and measured not only by having the STM detect the tunnel current or by having the AFM detect interatomic forces (infinitesimal forces); the sample surface structure and its physical and electrical properties may also be known by detecting such physical quantities as magnetic force, electrostatic force, light, electromagnetic waves, sound waves, distorted waves, heat (temperature) and capacitance. Near-field microscopes that employ any of such physical quantities may effectively combine with a miniature scanning electron microscope in the same manner as with the second embodiment.

Figure 6:
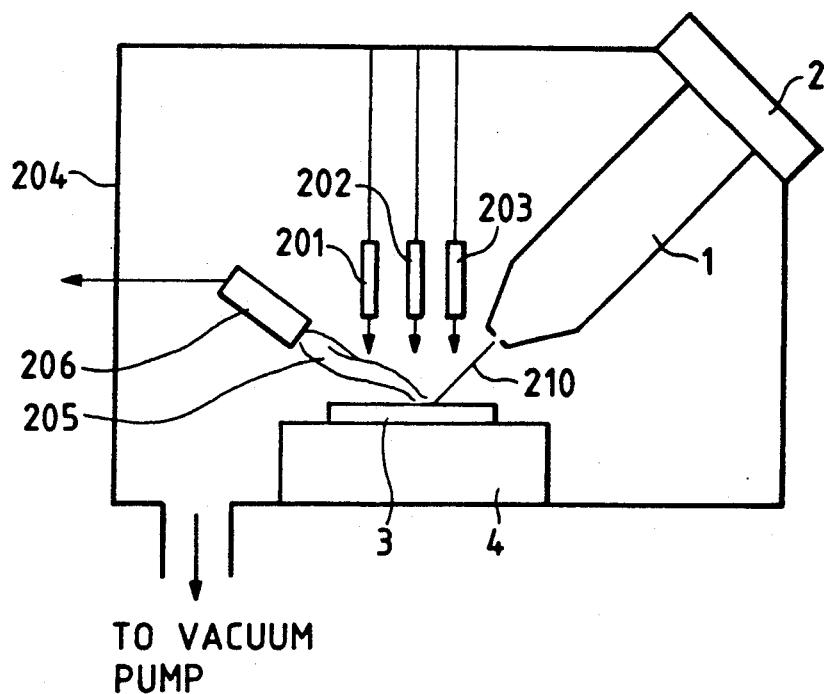
FIG. 6 is a sectional view illustrating how a molecular beam crystal growing device is combined with a scanning electron microscope as a third embodiment of the invention.

FIG. 6 schematically illustrates how a molecular beam crystal growing device is combined with a very small scanning electron microscope (SEM) as the third embodiment of the invention. This combination apparatus contains the SEM tube 1 with its moving mechanism 2 inside a sample chamber (processing chamber) of the molecular beam crystal growing device. The sample chamber in turn comprises molecular beam sources 201, 202 and 203. The SEM tube 1 and the moving mechanism 2 may be the same as those shown in FIG. 4. Because the SEM tube 1 is very small, the third embodiment also sues a common evacuation system to evacuate both the inside of the sample chamber 204 and that of the tube 1.

The third embodiment is operated illustratively as follows. Referring to FIG. 6, the sample 3 placed on the sample table 4 is a crystal growing substrate made of GaAs monocrystals. The molecular beam sources 201, 202 and 203 are Ga, Al and As sources, respectively. Prior to crystal grown on the sample (substrate) 3, the SEM tube 1 irradiates a finely focused electron beam 210 at the sample surface in scanning fashion. Secondary electrons 205 emitted from the sample surface as a result of the irradiation are detected by a secondary electron detector 206. The resulting detection signal is used to display on the screen a secondary electron image of the sample surface under SEM observation. This provides information about impurities and defects that may occur on the sample surface.

Thereafter, each of the Ga, Al and As sources generates a molecular beam directed at the surface of the sample 3 so that a GaAlAs layer of 20 nm crystal growth is formed thereon. The surface of the GaAlAs layer is checked under SEM observation for defects in the crystal growth. The processes of observing the substrate and the grown crystal surfaces and of growing crystals are then repeated. In this manner, a causal relation may be established between the impurities and defects on the substrate surface on the one hand, and the defects in the crystal growth on the other.

Figure 7:
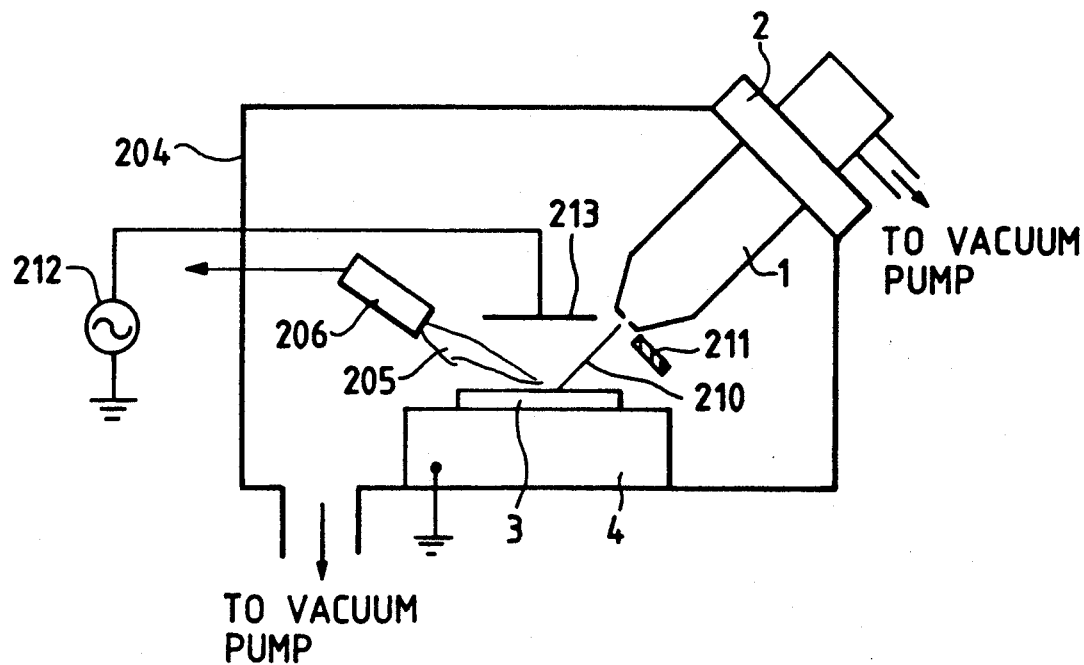
FIG. 7 is a sectional view indicating how a dry etching device is combined with a scanning electron microscope as a fourth embodiment of the invention.

FIG. 7 schematically indicates how a dry etching device that utilizes gas plasma is combined with a very small scanning electron microscope (SEM) as the fourth embodiment of the invention. In this combination apparatus, the SEM tube 1 movably supported by the moving mechanism 2 is incorporated inside the sample (processing) chamber 204 of the dry etching device. The SEM tube 1 is identical in structure to that shown in FIG. 4 and is very small. Its reduced size allows the SEM tube 1 to be located close to the sample 3 without adversely affecting the dry etching device in terms of performance.

Figure 8A:
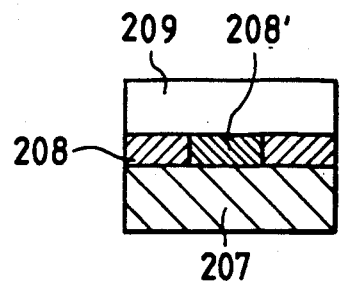
FIG. 8a–b is a set of sectional views of a sample (multilayer crystal body) subjected to etching and scanning microscopic observation by the combination apparatus of FIG. 7.
Figure 8B:
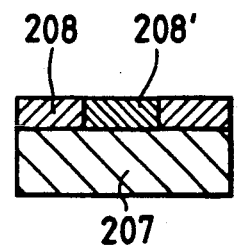

In the fourth embodiment, the sample 3 is a GaAs/GaAlAs multilayer crystal body as depicted in FIG. 8 (A). In this case, the crystal body is illustratively dry etched. In FIG. 8 (A), A GaAlAs layer 208 formed by crystal growth on a GaAs substrate 207 is 10 nm thick. On top of the layer 208 is a GaAs layer 209 that is 20 nm in thickness. In practice, This multilayer crystal body was produced using the molecular beam crystal growing device of FIG. 6. This GaAs/GaAlAs multilayer crystal body produced through molecular beam crystal growth is checked for crystal growth in the interfaces between the layers. The check requires selectively etching the multilayer crystal body after crystal growth. The etching should expose the surface of the target crystal layer for observation. These requirements are readily met by the fourth embodiment as described below.

First, with a shut-off valve 211 closing the tip of the SEM tube 1, a sample (multilayer crystal body) is placed on the sample table 4. After the processing chamber 204 is evacuated, a reactive gas such as $CCl_2F_2$ gas is introduced into the chamber. At the same time, a high frequency power source 212 is used to apply a high frequency voltage to an electrode 213. This generates a reactive gas plasma between the electrode 213 and the sample 3. The plasma thus generated is used to etch the sample 3.

The shut-off valve 211 is provided to shield (i.e., cut off) the interior of the SEM tube 1 from the space in which the sample is etched. That is, the purpose of the shut-off valve 211 is to prevent the reactive gas for etching from entering the SEM tube 1 so that electrodes and other sensitive electronic and optical parts will be protected against the corroding reactive gas. This feature keeps the electronic and optical characteristics of the tube 1 intact during etching operation.

In this fourth embodiment, the SEM tube 1 is evacuated by an evacuation system different from and independent of that for evacuating the processing chamber 204. The purpose of this arrangement is to maintain the high degree of vacuum within the SEM tube 1 (particularly in the space near the electron source) when the degree of vacuum in the processing chamber 204 is lowered by introduction of the reactive gas. Closing the shut-off valve 211 makes it easier to maintain the high degree of vacuum in the SEM tube 1 when the processing chamber 204 loses its degree of vacuum.

The above-described etching process that uses the $CCl_2F_2$ gas plasma is a very material-selective reactive etching process in that the GaAs layer is being etched while the GaAlAs layer is left intact. When the multilayer crystal body of FIG. 8 (A) is subjected to this etching process, The GaAs layer 209 at the top is etched and removed, exposing the GaAlAs layer 208 underneath (FIG. 8 (B)). There, the etching process automatically stops. At this point, the supply of the reactive gas and the application of the high frequency voltage are discontinued.

After the processing chamber 204 is evacuated, the shut-off valve 211 is opened. The SEM tube 1 is then operated to have the focused electron beam 210 scan the exposed surface of the GaAlAs layer 208 for SEM observation. Under SEM observation, checks are made illustratively for any crystal defect on the exposed surface and for the presence of a region 208' containing metal impurities, the latter phenomenon being evidence by a specific intensity distribution of secondary electrons emitted from the exposed surface.

Figure 9:
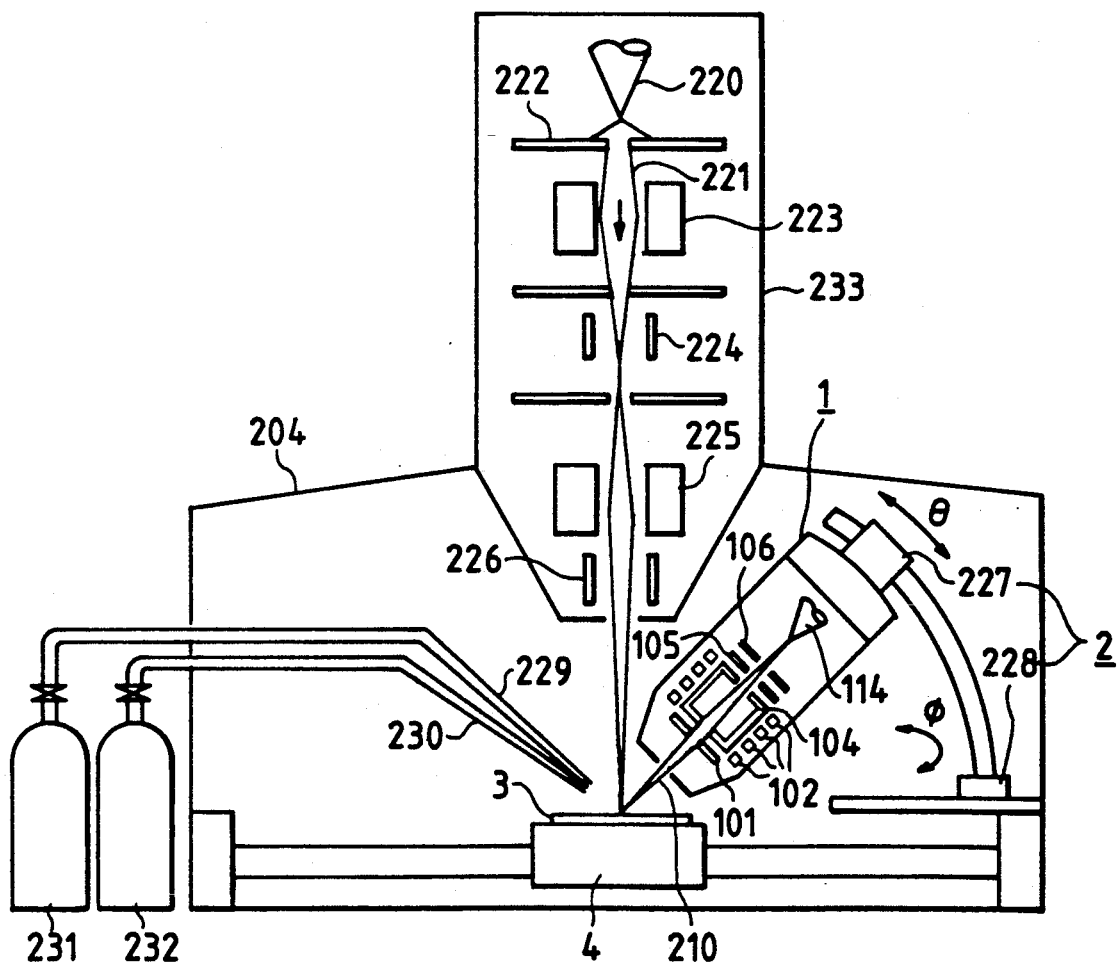
FIG. 9 is a sectional view showing how a focused ion beam device is combined with a scanning electron microscope as a fifth embodiment of the invention.

FIG. 9 schematically shows how a focused ion beam device (FIB) is combined with a very small scanning electron microscope (SEM) as the fifth embodiment of the invention. In this combination apparatus, an ion beam 221 is extracted by an ion extracting electrode 222 from an ion source 220. The extracted ion beam 221 is finely focused by a first convergent lens 223 and a second convergent lens 225 for irradiation onto the sample 3. During the process, the ion beam is turned on and off as needed by a blanking electrode 224. A deflecting electrode 226 controls the position of the ion beam irradiated spot on the sample surface.

While the ion beam 221 is being irradiated at the surface of the sample 3, a gas cylinder 231 supplies an etching gas through a nozzle 229 onto the same sample surface. This permits localized reactive etching of the ion beam-irradiated spot on the sample surface. During irradiation of the ion beam 22 at the surface of the sample 3, another gas cylinder supplies a CVD gas to the same sample surface. This triggers localized CVD reaction at the ion beam-irradiated spot on the sample surface. These localized processes are monitored by the SEM tube 1 installed in the sample chamber 204.

The sample chamber 204, an ion beam chamber 233 and the SEM tube 1 are independently evacuated by their respective independent evacuation systems, not shown. This evacuation setup maintains high degrees of vacuum in the ion beam chamber 233 and in the SEM tube 1.

The SEM tube 1 is attached to a $\theta$ driving section 227 and to a $\phi$ driving section 228. The $\theta$ driving section 227 changes an irradiation tile angle $\theta$ of the electron beam 210 with respect to the surface of the sample 3; the $\phi$ driving section 228 varies an irradiation azimuth $\phi$ of the electron beam 210 around the sample 3. These driving sections allow the SEM tube 1 to keep irradiating the electron beam at the sample 3 in an optimal direction (i.e., in terms of tilt angle and azimuth).

Secondary electrons emitted from the sample surface upon irradiation of the electron beam from the SEM tube 1 are detected by a secondary electron detector, not shown. The resulting detection signal is used to display an SEM image of the sample surface on the screen. This allows the locally processed shape of the sample described above to be monitored in detail.

In this case, the secondary electron detector is preferably mounted fixedly on the SEM tube 1 with a predetermined positional relation maintained therebetween. The fixed combination allows the secondary electron detector to move together with the SEM tube 1 when the latter is moved, making it possible always to detect secondary electrons under the same conditions regardless of the extent of the tube movement.

For another kind of check, the electron beam from the SEM tube 1 may be irradiated to the side wall of a hole made on the sample 3 with the ion beam 221 to a suitable depth where desired for SEM observation. This permits easy observation of a cross-sectional structure at a desired position of the sample 3.

Figure 10:
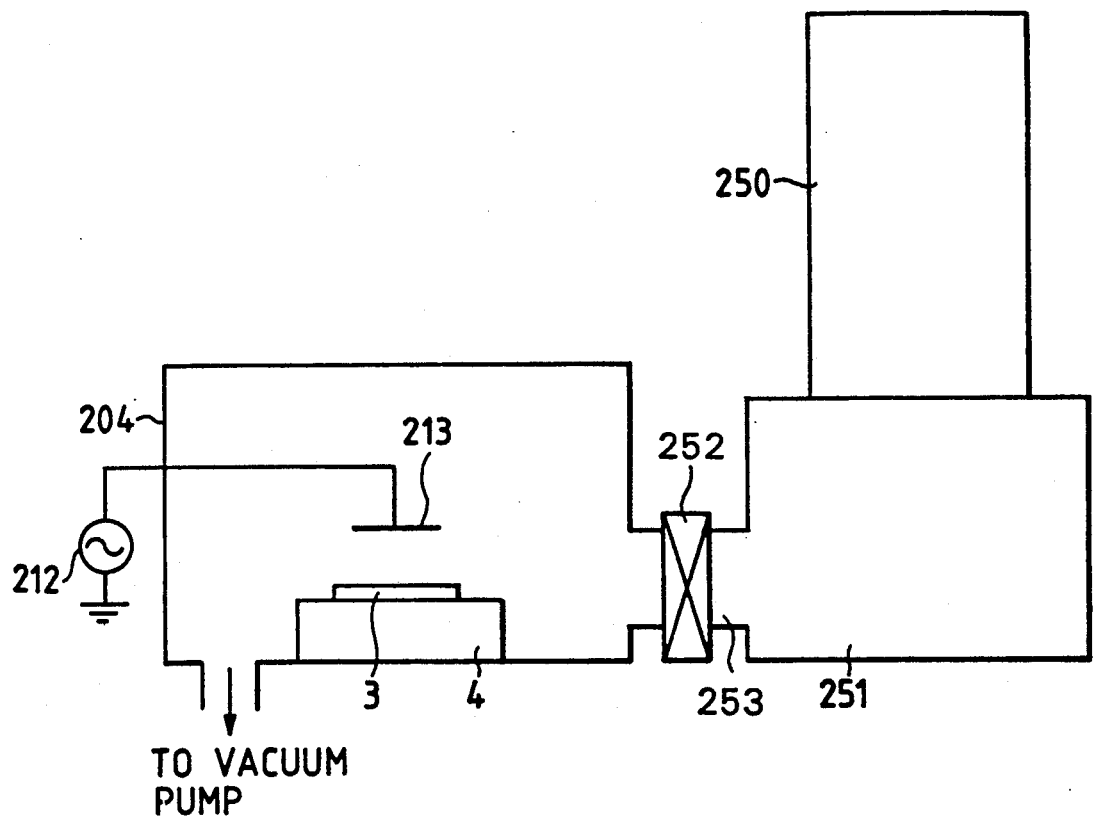
FIG. 10 is a sectional view depicting how processing equipment is conventionally combined with a scanning electron microscope.

Conventionally, the sample processing state is placed under SEM observation by one of two methods. One method is to take out the sample form within the processing equipment and into the atmosphere before introducing it into the sample chamber of the scanning electron microscope for observation. The other method, as shown in FIG. 10, is to install a sample chamber 251 for SEM observation comprising a large SEM tube 250 alongside the sample chamber 204 for processing, the two sample chambers being connected via a connecting duct 253 having a gate valve 252, wherein the sample 3 is moved through the connecting duct from the sample chamber 204 after processing to the sample chamber 251 for SEM observation.

One problem with the first prior method is that exposing the sample to the atmosphere can cause oxidation on the sample surface or sticking of impurities thereto. One problem with the second prior art method is its need for a very large apparatus combining the SEM with the processing equipment. The huge combination necessarily involves complex evacuation and sample moving mechanisms. Complex mechanisms often mean complicated operations by which to run the apparatus.

By contrast, each of the preferred embodiments of the invention incorporates a miniature SEM tube 1 in the sample chamber 204 for processing. This construction keeps the whole apparatus small and eliminates the need for a sample relocating mechanism to be run when processing and observation are alternated. Because the SEM tube is very small, it can share an evacuation system with an apparatus, such as a molecular beam crystal growing device, whose sample chamber is maintained at a high degree of vacuum. Since the SEM tube is movably positioned with respect to the sample, various regions of the sample are observed in various directions without changing the processing conditions, i.e., without relocating the sample.

Figure 11:
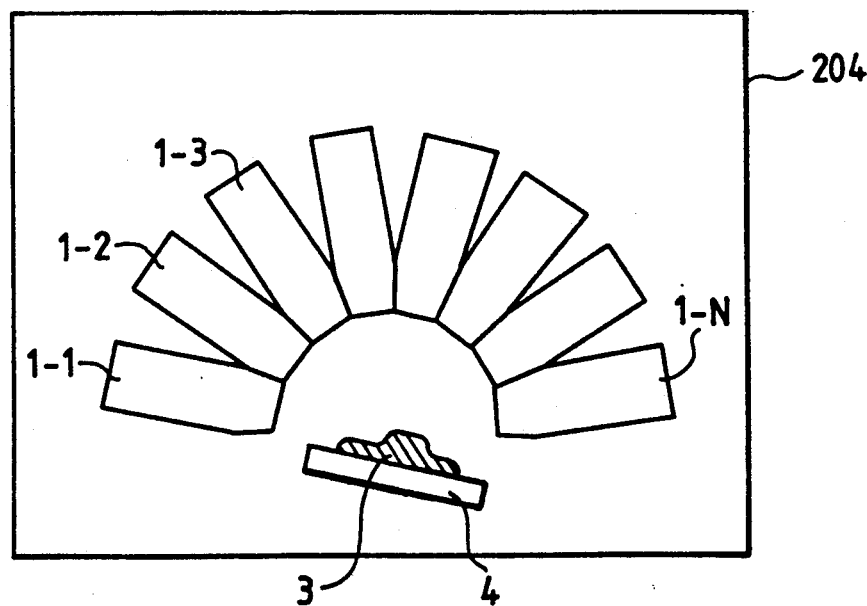
FIG. 11 is a sectional view illustrating a combination apparatus comprising a plurality of focused electron beam irradiating devices the apparatus being practiced as a sixth embodiment.

The above-described embodiments are each a combination apparatus in which a single SEM tube contained in the sample chamber is relatively moved with respect to the sample so as to change the irradiated spot and the direction of the focused electron beam irradiated. Alternatively, as shown in FIG. 11, the sample chamber 204 may comprise a plurality of SEM tubes 1-1, 1-2, 1-3, . . . 1-N, at least one of which may be selected for use. In FIG. 11, the multiple SEM tubes are arranged along a circular arc whose center is aligned with the sample, the tubes being positioned at angles to one another and directed at the sample. Alternatively, the multiple SEM tubes may be positioned in parallel with one another or in any other appropriate manner.

As described in detail and according to the invention, a small SEM tube, practiced as the focused electron beam irradiating means, is incorporated in the sample chamber of the observing, measuring or processing equipment. This structure constitutes a combination apparatus that remains small in size while containing the scanning electron microscope.

According to the invention, the sample chamber of the observing, measuring or processing equipment shares a common evacuation system with the SEM tube practiced as the focused electron beam irradiating means. This feature allows the equipment to combine with the scanning electron microscope without separately providing for an evacuation system for exclusive use by the SEM tube.

According to the invention, the SEM tube as the focused electron beam irradiating means is varied in position relative to the sample in the sample chamber of the observing, measuring or processing equipment. This feature allows the equipment to combine with the scanning electron microscope without requiring a sample moving mechanism for relocating the sample for SEM observation.

According to the invention, a plurality of small SEM tubes as the focused electron beam irradiating means are incorporated in the sample chamber of the observing, measuring or processing equipment, the SEM tubes being suitably switched for single-tube or combined use. This feature makes it possible to change, as desired, the irradiated spot of the focused electron beam on the sample, as well as the direction of the beam irradiated thereto.

Also according to the invention, the interior of the SEM tube used as the focused electron beam irradiating means is shielded (i.e., cut off) by suitable means from the space in which the sample is processed by the processing equipment. The shielding means keeps the scanning electron microscope unaffected in performance inside the combination apparatus, wherein processing and SEM observation are alternately performed.

While the preferred embodiments of the invention have been described using specific terms, such description is for illustrative purposes only, and it is to be understood that changes and variations may be made without departing from the spirit or scope of the appended claims.

What is claimed is:

1. A combination apparatus having a scanning electron microscope means, comprising:
   means for performing one of observing, measuring and processing operations on a sample placed in a sample chamber;
   said sample chamber containing a focused electron beam irradiating unit and a second electron detector apart from the means for performing one of said observing, measuring and processing operations;
   said focused electron beam irradiating unit including means for irradiating a finely focused electron beam onto the surface of said sample for electron microscopic observation in scanning fashion; and
   said secondary electron detector including means for detecting the secondary electrons emitted from said sample upon irradiation of the sample by the electron beam irradiated by said focused electron beam irradiating unit,
   wherein said focused electron beam irradiating unit further includes an electron source, an entirely electrostatic convergent lens system and a deflecting system; said convergent leans system converging the electron beam coming from said electron source onto said sample; and said deflecting system being arranged to scan the focused electron beam on said sample; and
   wherein said convergent lens system further includes an electrostatic objective lens for ultimately converging the electron beam coming from said electron source onto said sample; said electrostatic objective lens including first and second lens electrodes opposed to each other in the direction of the propagation of said electron beam; said first and said second lens electrodes being respectively located near said sample and said electron source; the potential of said second lens electrode being held positive relative to that of said first lens electrode; and the principal plane of said electrostatic objective lens being positioned closer to said sample than to the bottom surface of said first lens electrode.

2. A combination apparatus according to claim 1, further comprising a means for moving said focused electron beam irradiating unit relative to said sample.

3. A combination apparatus according to claim 2, wherein said means for observing and measuring said sample includes an atomic force microscope.

4. A combination apparatus according to claim 2, further comprising a means for shielding the internal space of said focused electron beam irradiating unit from the space in which said sample is processed.

5. A combination apparatus according to claim 2, wherein said means for processing said sample includes a molecular beam crystal growing device.

6. A combination apparatus according to claim 2, wherein said means for processing said sample includes a dry etching device utilizing gas plasma.

7. A combination apparatus according to claim 2, wherein said means for processing said sample includes a focused ion beam device.

8. A combination apparatus according to claim 2, wherein said means for observing and measuring said sample includes a scanning tunneling microscope.

9. A combination apparatus according to claim 1, further comprising a means for supporting said focused electron beam irradiating unit and said secondary electron detector with a predetermined positional relation maintained therebetween, and for moving in combination said focused electron beam irradiating unit and said secondary electron detector relative to said sample.

10. A combination apparatus according to claim 3, further comprising a means for shielding the internal space of said focused electron beam irradiating unit from the space in which said sample is processed.

11. A combination apparatus according to claim 9, wherein said means for observing and measuring said sample includes an atomic force microscope.

12. A combination apparatus according to claim 9, wherein said means for observing and measuring said sample includes a scanning tunneling microscope.

13. A combination apparatus according to claim 9, wherein said means for processing said sample includes a molecular beam crystal growing device.

14. A combination apparatus according to claim 9, wherein said means for processing said sample includes a dry etching device utilizing gas plasma.

15. A combination apparatus according to claim 9, wherein said means for processing said sample includes a focused ion beam device.

16. A combination apparatus according to claim 1, further comprising a shared evacuation system for evacuating said sample chamber and said focused electron beam irradiating unit.

17. A combination apparatus according to claim 16, wherein said means for observing and measuring said sample includes an atomic force microscope.

18. A combination apparatus according to claim 16, wherein said means for observing and measuring said sample includes a scanning tunneling microscope.

19. A combination apparatus according to claim 16, wherein said means for processing said sample includes a molecular beam crystal growing device.

20. A combination apparatus according to claim 16, wherein said means for processing said sample includes a dry etching device utilizing gas plasma.

21. A combination apparatus according to claim 16, wherein said means for processing said sample includes a focused ion beam device.

22. A combination apparatus according to claim 16, further comprising a means for shielding the internal space of said focused electron beam irradiating unit from the space in which said sample is processed.

23. A combination apparatus according to claim 1, further comprising a means for shielding the internal space of said focused electron beam irradiating unit from the space in which said sample is processed.

24. A combination apparatus according to claim 1, wherein said means for observing and measuring said sample includes an atomic force microscope.

25. A combination apparatus according to claim 1, wherein said means for observing and measuring said sample includes a scanning tunneling microscope.

26. A combination apparatus according to claim 1, wherein said means for processing said sample includes a molecular beam crystal growing device.

27. A combination apparatus according to claim 1, wherein said means for processing said sample includes a dry etching device utilizing gas plasma.

28. A combination apparatus according to claim 1, wherein said means for processing said sample includes a focused ion beam device.

29. A combination apparatus having a scanning electron microscope means, comprising:
   means for performing one of observing, measuring and processing operations on a sample placed in a sample chamber;
   said sample chamber containing a plurality of focused electron beam irradiating units apart from the means for performing one of said observing, measuring and processing operations;
   each of said focused electron beam irradiating units including means for irradiating a finely focused electron beam onto the surface of said sample for electron microscopic observation in scanning fashion, and one of said focused electron beam irradiating unit being selected for said microscopic observation in said fashion,
   wherein each said focused electron beam irradiating unit further includes an electron source, an entirely electrostatic convergent lens system and a deflecting system; said convergent lens system converging the electron beam coming from said electron source onto said sample; and said deflecting system being arranged to scan the focused electron beam on said sample; and
   wherein said convergent lens system further includes an electrostatic objective lens for ultimately converging the electron beam coming form said electron source onto said sample; said electrostatic objective lens including first and second lens electrodes opposed to each other in the direction of the propagation of said electron beam; said first and said second lens electrodes being respectively located near said sample and said electron source; the potential of said second lens electrode being held positive relative to that of said first lens electrode; and the principal plane of said electrostatic objective lens being positioned closer to said sample than to the bottom surface of said first lens electrode.

* * * * *